(12) United States Patent
Kishinevski et al.

(10) Patent No.: US 10,522,720 B2
(45) Date of Patent: Dec. 31, 2019

(54) CONVERTER PLATE FOR PRODUCING POLYCHROMATIC LIGHT

(71) Applicants: Anatoly Kishinevski, Holyoke, MA (US); Justin Herzig, North Hatfield, MA (US)

(72) Inventors: Anatoly Kishinevski, Holyoke, MA (US); Justin Herzig, North Hatfield, MA (US)

(73) Assignee: ANATOLY GLASS, LLC, North Hatfield, MA (US)

( * ) Notice: Subject to any disclaimer, the term of this patent is extended or adjusted under 35 U.S.C. 154(b) by 0 days.

(21) Appl. No.: 15/902,229

(22) Filed: Feb. 22, 2018

(65) Prior Publication Data
US 2018/0254388 A1 Sep. 6, 2018

Related U.S. Application Data

(60) Provisional application No. 62/463,654, filed on Feb. 25, 2017.

(51) Int. Cl.
*H01L 33/50* (2010.01)
*G02B 6/02* (2006.01)
(Continued)

(52) U.S. Cl.
CPC ...... *H01L 33/505* (2013.01); *C03B 37/01214* (2013.01); *C03B 37/028* (2013.01);
(Continued)

(58) Field of Classification Search
CPC ... H01L 33/505; H01L 33/504; H01L 33/507; H01L 2933/0041; C03B 37/01214;
(Continued)

(56) References Cited

U.S. PATENT DOCUMENTS 3,977,855 A 8/1976 Cole
5,276,758 A * 1/1994 Hughes .................. G02F 1/383
385/116

(Continued)

OTHER PUBLICATIONS

Dejneka et al.,"Rare earth-doped glass microbarcodes", PNAS, pp. 389-393, vol. 100 No. 2 (Jan. 2003).

(Continued)

*Primary Examiner* — Jerry M Blevins
(74) *Attorney, Agent, or Firm* — Browdy and Neimark, P.L.L.C.

(57) ABSTRACT

A converter plate includes an array of optical fibers arranged axially parallel to each other. The optical fibers have optical properties selected to convert light from a light-emitting diode entering the optical fibers from one end of the array of optical fibers to light of a different wavelength exiting the fibers from another end of the array of optical fibers. The optical properties of some of the optical fibers differ from the optical properties of others of the optical fibers such that the light exiting the some of the optical fibers has a wavelength different from that of the light exiting the others of the optical fibers. The converter plate is manufactured by providing the optical fibers and combining the optical fibers into a bundle, the optical fibers being arranged axially parallel to each other. The bundle of optical fibers is drawn to attenuate the bundle of fibers into a secondary fiber having a reduced cross section. The secondary fiber is wafered into a converter plate that includes an array of the optical fibers arranged axially parallel to each other.

20 Claims, 7 Drawing Sheets

(51) Int. Cl.
*G02B 6/08* (2006.01)
*C03B 37/028* (2006.01)
*C03B 37/012* (2006.01)

(52) U.S. Cl.
CPC ............ *G02B 6/02033* (2013.01); *G02B 6/08* (2013.01); *H01L 33/504* (2013.01); *C03B 2201/34* (2013.01); *C03B 2203/40* (2013.01); *H01L 33/507* (2013.01); *H01L 2933/0041* (2013.01)

(58) Field of Classification Search
CPC .............. C03B 37/028; C03B 2201/34; C03B 2203/40; G02B 6/02033; G02B 6/08
USPC ........................................................ 385/115
See application file for complete search history.

(56) References Cited

U.S. PATENT DOCUMENTS

| | | | |
|---|---|---|---|
| 5,394,498 A | 2/1995 | Hinterlong et al. | |
| 5,953,477 A * | 9/1999 | Wach ................. | A61B 5/14546 385/115 |
| 6,487,351 B1 | 11/2002 | Cryan et al. | |
| 6,812,500 B2 | 11/2004 | Reeh et al. | |
| 9,202,996 B2 | 12/2015 | Orsley et al. | |
| 2002/0054740 A1 * | 5/2002 | Vakili ..................... | G02B 6/14 385/115 |
| 2005/0191055 A1 * | 9/2005 | Maruyama ......... | G02B 6/12019 398/45 |
| 2008/0290301 A1 | 11/2008 | Gardner | |
| 2009/0054957 A1 | 2/2009 | Shanbaky | |
| 2010/0116976 A1 * | 5/2010 | Wober ................... | B82Y 20/00 250/227.23 |
| 2012/0107622 A1 | 5/2012 | Borrelli et al. | |
| 2015/0147229 A1 * | 5/2015 | Fewkes ................... | A61L 2/085 422/24 |
| 2016/0170044 A1 | 6/2016 | Arodzero et al. | |
| 2018/0038560 A1 * | 2/2018 | Neuberger ................ | F21K 9/64 |
| 2018/0216002 A1 * | 8/2018 | Nagao .................. | A61B 1/0653 |

OTHER PUBLICATIONS

Ikhlef et al., "Application of a plastic scintillating fiber array for low-energy x-ray imaging", Applied Optics, pp. 8081-8084, vol. 37, No. 34 (Dec. 1998).
Sohn et al., "Stacked quantum dot embedded silica film on a phosphor plate for superior performance of white light-emitting diodes", ACS Appl Mater Interfaces, pp. 5744-5748, vol. 6, No. 8 (Apr. 2014).
Press Release, "Introducing Superior X-ray Imaging with SCHOTT's Fiber Optic Faceplates and BOROFLOAT® Glass", SCHOTT, (Nov. 2016).

* cited by examiner

CONVERTER PLATE FOR PRODUCING POLYCHROMATIC LIGHT

CROSS-REFERENCE TO RELATED APPLICATION

This patent application claims the benefit of U.S. Provisional Application 62/463,654, filed Feb. 25, 2017, the entire disclosure of which is hereby incorporated herein by reference.

TECHNICAL FIELD

The present invention is in the technical field of light emitting devices. More particularly, the present invention is in the technical field of light converting technology. More specifically this invention relates to a converter plate that can convert light from sources such as LEDs into varying wavelengths of light existing within the visible, ultra violet (UV) and infra-red (IR) parts of the electromagnetic spectrum, or any combination of those regions of the electromagnetic spectrum. The present invention also relates to the manufacture of such converter plates.

BACKGROUND

LED assemblies typically include a light emitting diode paired with a layer or layers of material that can convert the emission of photons from the light emitting diode to alternate wavelengths of energy. Conventional LED assemblies used for consumer lighting (white light) are composed of two primary components. The two components include the light emitting diode (semiconductor junction) and a layer of a converter material. The layer of converter material is a component that, when light is passed through it, will convert the incoming light to light of a different wavelength. The light converting material is configured so that it is in line with the photo-emission of the LED and serves the purpose of down converting (or in rare instances, up-converting) a portion or all of the photo-emission of the LED to a select region of the electromagnetic spectrum, typically with the goal of producing light perceived as white light by the eye. Down converting involves converting a higher-energy input to a smaller-energy output with longer wavelengths, and up-converting involves converting a smaller-energy input to a higher-energy output with shorter wavelengths, with multiple photons being combined and re-emitted as a single photon.

The light emitting diode used in a most classic consumer configuration emits in the near-UV part of the electromagnetic spectrum with a monochromatic photo emission peak ranging from approximately 390-440 nm with a full width half max of the emission peak being typically on the order of several tens of nanometers. Thus, the diode emits over a very narrow emission range. There are a variety of LED types used to produce this near-UV emission including, for example, but not limited to, InGaN, GaN, GaAsP, GaP, etc.

A converting material layer is typically mounted or adhered onto or in direct line with an LED or path of the photons emitted from an LED. The converting material layer is typically uniform. The short-wavelength photons (typically near UV) from the LED pass through the converter material layer, and a substantial portion of the photons are absorbed by the converter material and optically active atoms within the converter material, and then are re-emitted as a lower energy wavelength of light. In some rare instances the converted light may be of higher energy wavelengths than the incident light, although this is not common. In most instances, intentionally, a small percentage of the LED photons are allowed to pass through the converter material layer without being converted, adding to the net emission spectrum of the LED assembly because the particular wavelength of light emitted by the diode may be desirable.

The most common converter material used for white light production is a cerium doped yttria aluminum garnet ceramic (Ce:YAG) either in the form of a small plate (converter plate) in the form of a monolithic layer, or as a powder suspended in a glass or polymer matrix, known as phosphor in glass (PIG). The glass matrix is usually a low-temperature glass so that the phosphors are not altered by the heat, because the phosphors may be irreversibly damaged if exposed to temperatures that are too high. The powder suspension and the converter plate function in the same manner, and there may be an additional plastic layer through which the light passes after the converter plate. The configuration of a near-UV LED paired with the Ce:YAG converter material produces a net output of light that is perceived by the human eye as white light and is the classic method of producing white-light LEDs assemblies. This method offers very high luminous efficacy.

Despite the benefit of very high efficiency, the prior described technology can lack the ability to produce a full spectrum or complete spectrum "white" light and can exhibit poor color rendering. The emission spectrum of the UV LED paired with a Ce:YAG converter material, when resolved into its spectral components, is primarily di-chromatic, i.e., possessing only two peaks. One spectral peak is centered around the emission wavelength of the base LED (blue or near ultra violet) and the second spectral peak is centered around the primary emission wavelength of the converter material (approximately, but not exactly yellow/green, 560 nm, for Ce:YAG). Converter materials other than Ce:YAG can be used to produce a wide range of colors besides white. For example, Ce:LuAG converter plates can be used to produce a bright green color when paired with a near UV LED.

Manufacturers of white light LED assemblies have attempted to shift the emission spectrum to be warmer (containing more red) and/or be more complete, i.e., achieving a continuous full spectrum white light. The current methods used by manufacturers to produce a more complete white light spectrum include incorporating additional luminescent materials (phosphors), either as part of the converter material layer or in addition to it, such as in or on the plastic or glass casing around the LED assembly. For example, the plastic housing around an LED light bulb may contain additional phosphors (in addition to the Ce:YAG converter material) which are selected and utilized in careful proportions to add specific parts of the visible spectrum i.e. green, yellow, orange, etc.

The PIG (phosphor in glass) configuration relies on a mixture or blend of phosphors, suspended in a sufficient transparent medium, placed in front of the near UV LED, to produce a fuller spectrum of white light, or any desired color. In the PIG configuration there is an obstructed path of photons through the PIG material as there is no organized structure and some phosphor grains may obstruct the path of photons, resulting in loss of potential number of photons emitted. As the phosphor grains are randomly distributed in the host matrix, there is a resulting loss of efficiency in production of light, albeit color rendering achieved may be much improved compared to the simple Ce:YAG converter plate inclusive LED assembly.

Quantum dot converter plates us a technology similar to a laser jet printer to print phosphors onto a substrate of glass or acrylic. Alternatively, printing can be done directly onto a diode junction. Another technique involves encapsulating a wide range of phosphors into a layer, with the distribution not being finely tuned.

SUMMARY

According to one aspect of the invention, a converter plate includes an array of optical fibers arranged axially parallel to each other. The optical fibers have optical properties selected to convert light from a light-emitting diode entering the optical fibers from one end of the array of optical fibers to light of a different wavelength exiting the fibers from another end of the array of optical fibers. The optical properties of some of the optical fibers differ from the optical properties of others of the optical fibers such that the light exiting the some of the optical fibers has a wavelength different from that of the light exiting the others of the optical fibers.

In certain embodiments at least some the optical fibers are unclad, or at least some of the optical fibers are clad with a cladding that may or may not be optically active. The cladding may causes total internal reflection within the optical fibers so that light exits only through an end of the optical fibers, or the cladding may include a material that absorbs light and re-emits the light in a different wavelength, or the cladding may perform both functions. At least some of the optical fibers may be formed of a host material that is intrinsically light-converting, or at least some of the optical fibers may have a light-converting material incorporated into a host material that exhibits no light converting properties. At least some of the optical fibers have a plurality of light-converting materials incorporated into a host material, the plurality of light-converting materials having differing optical properties. The optical fibers may have optical properties selected to convert UV or near-UV light from the light-emitting diode to light of a different wavelength, and the optical properties of the optical fibers may be selected to produce a continuous spectrum of light, or a full spectrum of white light, from the light from the light emitting diode.

According to another aspect of the invention, a converter plate is manufactured in accordance with a method that includes providing optical fibers having optical properties selected to convert light entering the optical fibers from one end to light of a different wavelength exiting the fibers from another end. The optical properties of some of the optical fibers differ from the optical properties of others of the optical fibers such that the light exiting the some of the optical fibers would have a wavelength different from that of the light exiting the others of the optical fibers. The optical fibers are combined into a bundle, the optical fibers being arranged axially parallel to each other. The bundle of optical fibers is drawn to attenuate the bundle of fibers into a secondary fiber having a reduced cross section. The secondary fiber is wafered into a converter plate that includes an array of the optical fibers arranged axially parallel to each other.

In certain embodiments, prior to the wafering step, the secondary fiber is combined with other secondary fibers as a bundle of secondary fibers arranged axially parallel to each other, and the bundle of secondary fibers is drawn to attenuate the bundle of secondary fibers into a tertiary fiber. The step of wafering the secondary fiber includes wafering the tertiary fiber that includes the secondary fiber and the other secondary fibers. In other embodiments, prior to the wafering step, the tertiary fiber is combined with other tertiary fibers as a bundle of tertiary fibers arranged axially parallel to each other, and the bundle of tertiary fibers is drawn to attenuate the bundle of secondary fibers into quaternary fiber. The step of wafering the secondary fiber comprises wafering the quaternary fiber.

The step of drawing the bundle of optical fibers to attenuate the bundle of fibers into a secondary fiber having a reduced cross section can include pulling the bundle of optical fibers through a furnace with an output rate of material passing through the furnace being greater than an input rate of material passing into the furnace. The furnace may be operated at a temperature selected relative to the glass transition temperature of the optical fibers so as to result in controlled attenuation of the optical fibers. The step of pulling the bundle of optical fibers through the furnace can cause adjacent fibers to fuse to each other in a permanent bond.

Converter plates according to the invention can produce any desired emission spectrum in the UV, visible, or near-IR regions of the electromagnetic spectrum, by tuning the type and relative concentrations of the light converting materials incorporated into its structure during manufacture. The total number of individual light-converting points in the converter plate may exceed several million, but may also be only several hundred or thousands.

The details of various embodiments of the invention are set forth in the accompanying drawings and the description below. Numerous other features and advantages of the invention will be apparent from the description, the drawings, and the claims.

DESCRIPTION OF THE DRAWINGS

Identical parts are indicated by the same reference numerals. Indices with letters indicate different versions of the same element.

DETAILED DESCRIPTION

Figure 1:
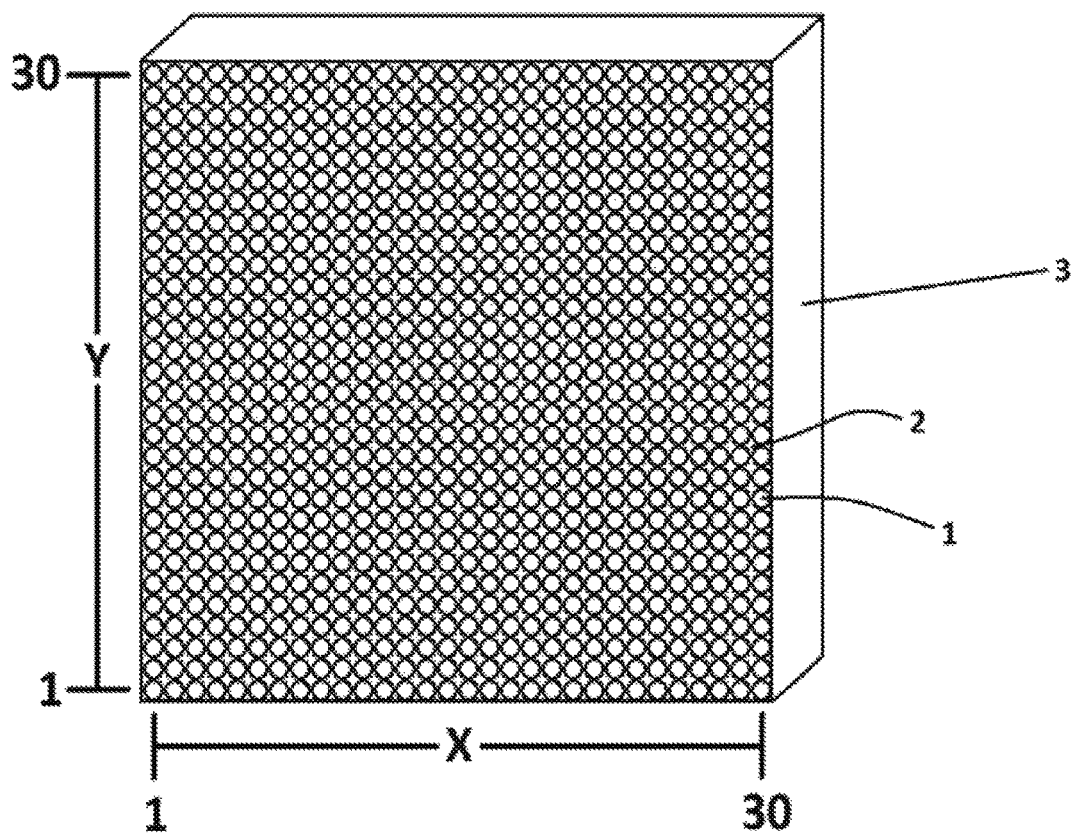
FIG. 1 is a drawing of a converter plate manufactured in accordance with the invention.

The present invention relates to a converter plate that converts UV or near-UV light (such as from an LED) to light in the infrared, visible, UV, or any combination of those regions of the electromagnetic spectrum.

The converter plate may consist of numerous phosphorescent or fluorescent phosphors or light-converting materials distributed in a highly structured and period, manner, laterally oriented from each other on a single plane of a carefully tuned thickness. The structured and period distribution of the phosphors, or optically active materials, is similar in geometry to pixels in an LED display. Similarly, the distribution can be pictured, on an expanded scale, as cells in a bee's honeycomb (not necessarily hexagonal in cross-sectional geometry) with each cell being the position of a carefully selected phosphor or light-converting material. Each ell or "pixel" of the converter plate typically consists of only one light-producing material (phosphor, ion, etc.). It is possible, however, in some instances, in an intentional and controlled manner to achieve a particular balance of light emission by the converter plate. There may be more than one type of phosphor in a pixel.

The scale of each pixel, or phosphor point in the converter plate described herein, may range form as small as several tens of nanometers to as much as several tens of micrometers. Each cell or pixel of light-converting material may or may not have a cladding around it of a clear glass or polymer, or any other transparent, translucent, or light-converting material.

Through careful selection, blending, and distribution of the phosphors through the cross section of the converter plate and in each position of a pixel (through precise positioning of fibers within the large bundles of fibers), the emission spectrum produced by the converter plate can be tuned to produce any spectrum of light. Each pixel position in the converter plate may consist of a phosphor or phosphorescent material with any desired peak emission wavelength. This means that the converter plate could consist of dozens or hundreds of phosphor materials in a periodic arrangement, with the possibility of intentional photoemission overlap of each pixel or cell (by including more than one phosphor in an initial fiber, or by having pixels that overlap each other somewhat), allowing a truly continuous white light net emission spectrum. The average light output or spectral distribution of the present invention, a converter plate, may be infinitely tuned to produce any color, which enables the industry to be able to produce a full-spectrum or more continuous spectrum LED converter plate.

The converter plate consist of a matrix of different light converting materials, which may be glasses (inorganic or organic), ceramics, or polymers. Each light converting material may be distributed throughout the converter plate in a highly periodic, regular, and carefully tuned manner taking into account relative concentrations of each light converting material and the net emission spectrum produced when the UV or near-UV light is passed through the selected light converting material.

The manner of producing the converter plate involves drawing fibers of a glass or material with optically active ions, with or without a cladding, by use of fiber draw tower that employs a hot zone and mechanical attenuation. Each fiber may have only one light converting material producing only one color, or the fiber may be a blend of light converting materials. The cladding may or may not be optically active itself, and may allow for tuning the performance of the final light converting plate. Single fibers, with various emission characteristics, are combined into a bundle or group of fibers, in a lateral and parallel orientation, and redrawn to produce a secondary fiber with a plurality of fibers (pixels or individual elements) within the cross section. The secondary fibers are then stacked or bundled together again and redrawn yet another time to produce a tertiary fiber with a compounding number of individual fibers (pixels or individual elements) within the cross section. The tertiary fibers may be stacked and redrawn a third time or wafered into converter plates and used as is. More specifically, the tertiary fibers may be wafered into thin sections, by any means appropriate, to a desired thickness to produce the individual converter plates, which are placed in line with a UV or near UV light source, typically an LED. In some instances the stacking and redrawing process may be completed more than three times, until the desired quantity of the light converting materials (pixels) are present per desired unit of cross sectional area.

The fibers may also be produced using a host glass with no color or optical activity, which has embedded or incorporated into its bulk a ceramic phosphor or other light-converting material. The fibers may also be of organic materials, such as a polymer made of or containing an organic phosphor.

One advantage of assembling converter plates as described herein, is the ability to precisely vary the concentrations of each fiber type, i.e., light-converting materials. Using various fibers, which produce different colors when excited by short-wavelength light, and carefully tuning the quantity of each of the light-converting materials in the converter plate, it is possible to tune the light output characteristics of the converter plate. One commercial merit of the current invention is its ability to produce a full-spectrum white light converter plate, which is in great demand by the consumer lighting market and LED manufacturing industry. The invention provides an infinitely tunable emission spectrum in a converter plate by allowing a large number of different light converting materials to be distributed throughout a small cross sectional area in a highly controlled and periodic manner.

The photon converting assembly (converter plate) exhibits a high efficiency of converting a near-UV or UV light source to visible light of an infinitely tunable emission spectrum. The high efficiency of conversion means that the number of photons exiting the converter plate is close to the number of photons entering the converter plate, due in large part to absence of phosphors overlapping each other. The present invention achieves this conversion by means of passing short wavelength photons, or any photons of sufficient energy, through a matrix of carefully distributed and proportioned phosphor (luminescent) materials, resulting in a conversion of the photon energy to different wavelengths.

The primary method of manufacturing the present invention involves drawing fibers of glass (phosphate, silicate, organic, inorganic, or any material exhibiting the phenomena of a Tg, or transition temperature of the fibers) which contain within the bulk of, or are made of, a light converting material, atoms, molecules or ions. The fibers are then stacked in lateral and parallel orientation to each other into a bundle (such as for example, but not limited to 12×12, 6 mm diameter fibers, square cross sectional geometry and 140 cm in length) and secured, and then redrawn, through a hot zone of sufficient energy to allow for the attenuation of the bundle of fibers into a smaller size, into a secondary fiber (multi-fiber) with cross-sectional geometry having a maximum dimension on the order of several millimeters.

The fibers are drawn (attenuated) from their original size and/or form/assembly by use of a furnace heated to appropriate temperature with respect to the Tg of the material being processed. The fiber assembly (for example, 12×12 array) is pulled from its original size and scale through a precisely temperature controlled furnace with the output rate of the material passing through furnace being greater than the input rate i.e. the result is an attenuation of the fiber or fiber bundle to a smaller dimension than the starting material. During the drawing process sufficient heat is present, which enables adjacent fibers to fuse to each other with a permanent bond.

The multi-fiber (secondary draw with multiple fibers in cross sectional area) is then assembled into a tertiary bundle (such as but not limited to, 12×12 fibers, square cross sectional geometry), which is then drawn a third time into a fiber with a proportionally compounding number of (fibers) elements in the cross sectional area of the tertiary fiber. To further define this, the first fiber is a single element. The second fiber (multi-fiber) is an array of, for example 12×12 single elements. This second fiber (multi-fiber) is redrawn in a third array of 12×12, resulting in a final multi-multi fiber with 20,736 (12×12×12×12) individual elements (fibers or pixels). The fiber containing 20,736 individual elements can consist of any concentration or proportion of various luminescent materials (phosphor containing glasses or luminescent glasses) ranging over any section of the visible spectrum, resulting in the ability to produce a carefully tuned net photon output of the converter plate. The tertiary fiber may be stacked and redrawn or it may be processed into converter plates at that point.

The tertiary fiber may then be wafered in thin slices of a precise thickness to produce a converter plate or may be stacked and drawn a fourth time to further increase the number of luminescent elements per square area. For example, the fibers containing 20,736 individual elements could be bundled into an array of 12×12 and redrawn into a fiber on the order of millimeters maximum cross sectional area resulting in a fiber with 2,985,984 individual elements within it. The final product is a fiber with millions of individual luminescent elements (pixels). Each element can be tuned from the beginning of the process to produce any region of the visible spectrum with a net photon output being tuned exactly to the final spectrum desired i.e. full spectrum white light or any variation or cumulative spectral emission.

The fibers may be that of a host glass with the light converting material (phosphor grains) distributed evenly throughout the bulk of the material. The phosphor grains distributed within the host glass/fiber may be a glassy or ceramic (for example a ceramic such as amber color producing BaAlSi(N, O)$_3$:Eu(2%)) material of organic, inorganic, or a composite structure. The fibers may also be that of a glass which contains atoms that are in their ionic state that are optically active and homogenously distributed throughout the bulk of the material such as glass that contains erbium, thullium, cerium, lutetium, holmium, etc. The glass itself may act as the light converting material or may have a secondary phase encapsulated within it.

The first fiber is drawn from a pre-formed billet or rod, to a scale of millimeters in cross sectional diameter, to a scale of millimeters in cross-sectional diameter, or maximum width of a face for non-circular fibers, and may or may not have a cladding material. In some instances, a cladding material is preferred to promote and tune the propagation of light and any total internal reflection. The cladding may also allow for tuning of numerical aperture of the fibers and overall converter plate. In some instances, it is favorable that there is no cladding so that light may refract laterally from some fibers into neighboring fibers. Single fibers of glasses that produce various colors (color producing composition or contain appropriate phosphor grains or light converting material) are bundled into an array and drawn a second time (the multi) to produce a secondary fiber with a cross-sectional diameter or maximum width of a face for non-circular fibers, on the order of several millimeters.

A variety of fibers are drawn, each producing a different spectral emission (color) when excited by UV or near-UV light, or any wavelength of light possessing enough energy to produce photoluminescence in the fiber. Fibers are bundled together in a cross sectional pattern such as for example, but not limited to a 12×12 square. The bundle may also be triangular, hexagonal, trapezoidal, or any geometry desired. The bundle of fibers consists of no less than two different color fibers. For example, three colors may be used to produce light perceived as white by the eye, which would include a red red emitting fiber, a blue emitting fiber, and a green emitting fiber. The bundle of fibers, consisting of multiple fiber colors, is drawn down to a fiber small relative to the size of the initial bundle (final size is on the order of several millimeters). The fibers consisting of multiple fibers are then bundled together a second time and are redrawn to produce a fiber with a quantity of individual fibers in the cross section equal to the square of the number of fibers in the first bundle. This bundling and redrawing may be repeated a third or fourth time as needed to achieve the fiber (pixel) size desired.

The final fiber, with the desired number of individual pixels in the cross-sectional geometry, is then wafered into thin slices (converter plates), which may be from fractions of a mm thick to several millimeters thick, or in extreme instances may be a centimeter or more. The converter plates, when excited by a near UV LED, will emit light that is a blend of the individual fiber colors which the converter plate is composed of. In the instance in which the emission peaks of the fibers are red, green blue the perceived light will be white if the quantity of photons of each wavelength is balanced. The perceived photo-output of the present invention can be adjusted by increasing and/or adding or subtracting fibers of various peak emission wavelengths.

Due to the nature of the manufacturing process and the tiny size of each pixel, many individual colors can by blended together to produce a converter plate ultimately yielding true white light or a spectrum nearly continuous, i.e. very high quality color rendering.

FIG. 1 is a representation of a general case of the present invention, a converter plate, with a tunable photo emission spectra and multiple types of light converting materials evenly distributed amongst the pixels. The x and y axis in FIG. 1 are that of a Cartesian coordinate system (x,y) in which the distance between points (1,1) and (30,1) is equal to the distance between (1,1) and (1,30), which is equivalent to approximately 1.1 mm distance. The thickness of the converter plate 3 is on the order of 0.4 mm, but may vary per desired performance characteristics of the converter plate. The pixels 1 are individual fibers that are fused to their adjacent neighbors by means of a successive fiber draw process in which fibers bundled together are drawn through a heat zone and attenuated into a single fiber with multiple fibers in the cross section. The fibers 1 (pixels) have a cladding 2 on them from the draw process, which provides a controlled spacing between each of the optically active elements. The cladding 2 provides an extra element of tunability in the optical emission spectra of the converter plate. The cladding causes light to bounce around within the fiber, possibly with total internal reflection so that light exits only through the end of the fiber, or, alternatively, the cladding material can result in absorption of light and re-emission in a different wavelength, or alternatively, a combination of these two effects of the cladding is possible. The cladding can also promote adhesion between different fibers. The cladding 2 may be transparent, opaque, or itself a light-converting material. In FIG. 1 pixels with the following coordinates represent one of three different color converting materials, for example converting materials that produce red, green, or blue emission spectra upon excitation with UV or near UV light. The converter plate in FIG. 1, which consist of 900 individual fibers (pixels) fused together, consists of three different light converting pixels, red, blue green, with each color occupying on third of the pixel spaces. The coordinates listed in the table below can be extrapolated in the same sequence for each group to fill all sites in the converter plate and define the color of each fiber (pixel).

TABLE 1

| Red Pixels (690 nm emission peak) | | | | | | | | | |
|---|---|---|---|---|---|---|---|---|---|
| 1, 1 | 1, 4 | 1, 7 | 1, 10 | 1, 13 | 1, 16 | 1, 19 | 1, 22 | 1, 25 | 1, 28 |
| 2, 2 | 2, 5 | 2, 8 | 2, 11 | 2, 14 | 2, 17 | 2, 20 | 2, 23 | 2, 26 | 2, 29 |
| 3, 3 | 3, 6 | 3, 9 | 3, 12 | 3, 15 | 3, 18 | 3, 21 | 3, 24 | 3, 27 | 3, 30 . . . |
| Blue Pixels (480 nm emission peak) | | | | | | | | | |
| 1, 2 | 1, 5 | 1, 8 | 1, 11 | 1, 14 | 1, 17 | 1, 20 | 1, 23 | 1, 26 | 1, 29 |
| 2, 3 | 2, 6 | 2, 9 | 2, 12 | 2, 15 | 2, 18 | 2, 21 | 2, 24 | 2, 27 | 2, 30 |
| 3, 1 | 3, 4 | 3, 7 | 3, 10 | 3, 13 | 3, 16 | 3, 19 | 3, 22 | 3, 25 | 3, 28 . . . |
| Green Pixels (530 nm emission peak) | | | | | | | | | |
| 1, 3 | 1, 6 | 1, 9 | 1, 12 | 1, 15 | 1, 18 | 1, 21 | 1, 24 | 1, 27 | 1, 30 |
| 2, 1 | 2, 4 | 2, 7 | 2, 10 | 2, 13 | 2, 16 | 2, 19 | 2, 22 | 2, 25 | 2, 28 |
| 3, 2 | 3, 5 | 3, 8 | 3, 11 | 3, 14 | 3, 17 | 3, 20 | 3, 23 | 3, 26 | 3, 29 . . . |

The converter plate shown in FIG. 1 is placed in direct line of the photoemission of a UV or near-UV LED. The LED photons enter the near side of the converter plate and are converted to the various colors (red, blue, green in this example) of light corresponding to each converter material type (pixel), with the net output being a blend of the different colors. The emitted light from the converter plate, may appear white, or any color desired by adjusting the quantity (proportions relative to each type) and emission character of the converting materials chosen for the elements (pixels) 1. The total number of individual elements 1 in a converter plate FIG. 1 may exceed tens of thousands per square millimeter and may consist of dozens of different light converting materials (colors). The many different colors, distributed in a controlled manner amongst the pixels 1, allow the production of a truly continuous spectrum of white light or any region of the IR, visible, or near UV electromagnetic spectrum desired.

Figure 2:
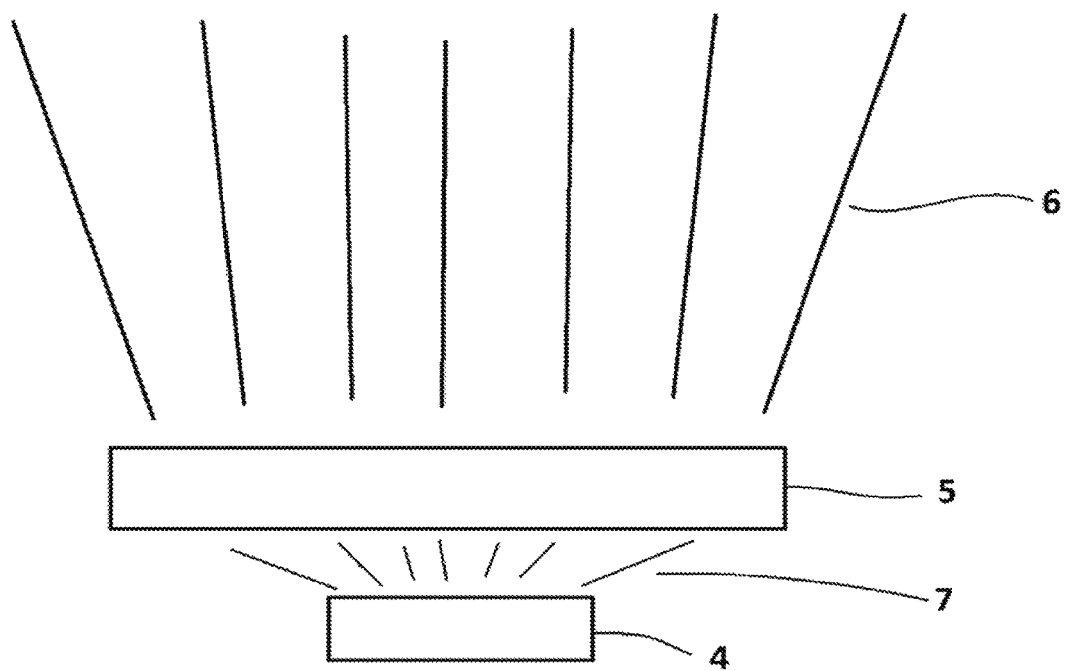
FIG. 2 is a schematic diagram of an LED and converter plate assembly in accordance with the invention.

FIG. 2 is a schematic diagram showing the configuration of the present invention, a converter plate 5 such as shown in FIG. 1 positioned, mounted, or placed in direct line with the photoemission 7 of a UV or near-UV LED 4. The photoemission 7 of the LED or near-UV LED 4 passes through the infinitely tunable converter plate 5 shown also in FIG. 1 and converts the light to a multitude of various wavelength photons 6. The emission color of photon 6 can be tuned by adjusting the quantity and color of each type material used for the individual pixels. Converter plate 5 may be processed to incorporate a non-planar geometry or surface topography, such as a curvature, in order to tune the manner in which light enters or leaves the converter plate. In particular, converter plate 5 may be slumped, sagged, ground and/or polished to introduce a concave, convex, or aspherical face on either side to assist with the uniform distribution of light emitted from the converter plate. The shape or geometry produced in the final converter plate is not limited to a simple concave, convex or aspherical configuration, but may be more elaborate such as including micro lenticels (Fresnel patterning) to achieve maximum release of light from the converter plate. The converter plate 5 may also have the surface roughened on a submicron scale to assist with entry and emission of light, or may include anti-reflection coatings.

Figure 3:
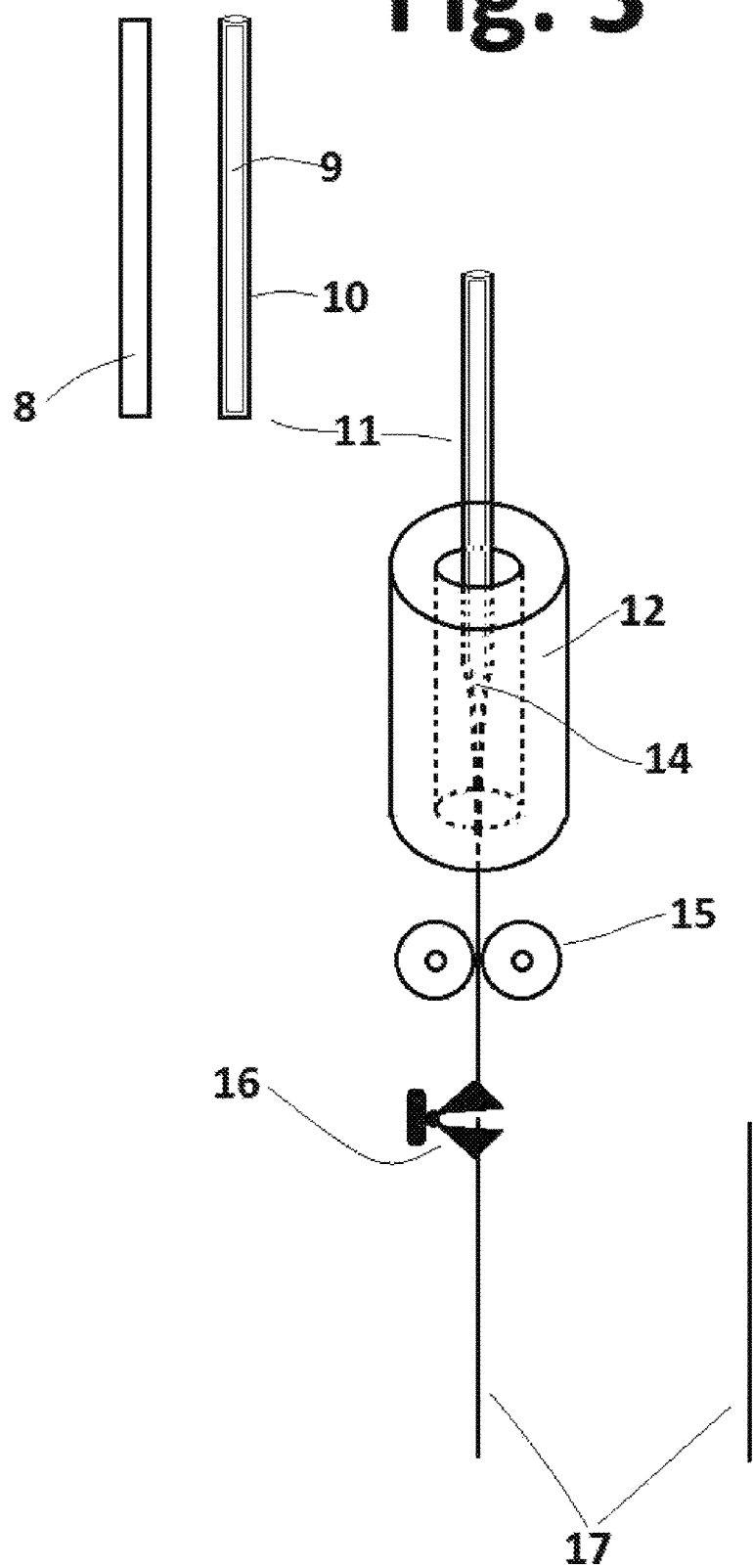
FIG. 3 is a drawing of a glass rod, a clad bar, and a schematic representation of an assembly for drawing of a clad tube into a small diameter relative to its starting diameter.

FIG. 3 illustrates the general process for drawing of a glass bar or cladded core bar into a small diameter relative to starting diameter. Glass rod 8 is doped with a constituent that promotes the glass fluorescing one or more colors when excited by ultraviolet light. Typical dopants are rare earth ions (Terbium, Samarium, Cerium, Europium, etc.), but non-rare earth optically active dopants such are copper, iron, vanadium may also be used, as well as ceramics or other types of optically active or light emitting materials. Clad bar 11 includes glass core bar, 9 and a clad tube 10. Core bar 9 may be equivalent to glass rod 8 or 28 shown in FIG. 4. Clad bar 11 may be optically active or not and may or may not contribute to the final emission spectrum produced by the converter plate. In some applications, modification of the converter plate's emission spectrum may be tuned in a favorable manner by employing a cladding material that has been doped by a rare earth such as cerium. Cladding 10 when doped by an appropriate rare earth, such as cerium, may assist in absorbing any stray ultraviolet light before it is able to exit the converter plate, rendering a softer white light. The index of refraction of clad tube 10 may also be tuned to control cross talk between fibers in the final assembly. This tuning is achieved by adjusting index of refraction of the clad glass in order to change critical angle and degree of total internal reflection achieved when the excitation ultraviolet enters into the converter plate.

Drawing of glass rods or fibers is industry standard practice in connection with fiberoptic components for displays and lighting operations, but not in connection with converter plates. For example, to increase the size of a small CCD display similar to a small video screen, it may be helpful to create a tapered fiberoptic component that is small at one end and large at the other end so that the image may be carried to the enlarged end. Scintillator plates or faceplates may be produced by bundling fibers together, but in contrast to converter plates, scintillator plates are not typically used in conjunction with LEDs and the material of the scintillator plates is chosen to be absorbent to X-rays and gamma rays and other kinds of high-energy radiation. Scintillator plates convert high-energy radiation into visible light, but because the nature of the output color is not a concern the concept of blending fibers together to achieve a different output spectrum or a wider emission spectrum is not relevant to such scintillator plates.

FIG. 3 schematically shows an apparatus for implementing the drawing of clad bar 11, which is a mass of glass that is fed into high-temperature furnace 12 at a controlled rate by an appropriate mechanism that can achieve smooth and controlled descent of the glass. The glass when in the furnace at a temperature above the softening point of the glass will begin to exhibit plastic behavior and may be fed into a tractor mechanism 15 that will draw the glass from the furnace at a controlled rate. The output speed of the glass from furnace 12 is typically faster than the input speed by at least a factor of two, thereby promoting attenuating of the glass in attenuation region 14 to fraction of its starting width and/or diameter dimension.

Glass fibers 17 exiting the furnace are cut by any appropriate cutting mechanism 16 such as two hardened metal blades that are pneumatically actuated, thereby achieving chopping of the fiber. It is also acceptable to have a machine operator manually cut fibers as they are coming out of the draw process.

If a clad tubing having core 9 and clad 10 is used, the assembly may be put under a state of vacuum while being fed into furnace 12 and being attenuated into a fiber 17. Putting the clad tube and core bar under vacuum during drawing promotes maximum interfacial bonding between the core and the clad and reduces occurrence of air bubbles, which have a negative effect on the efficiency of the converter plate.

Figure 4:
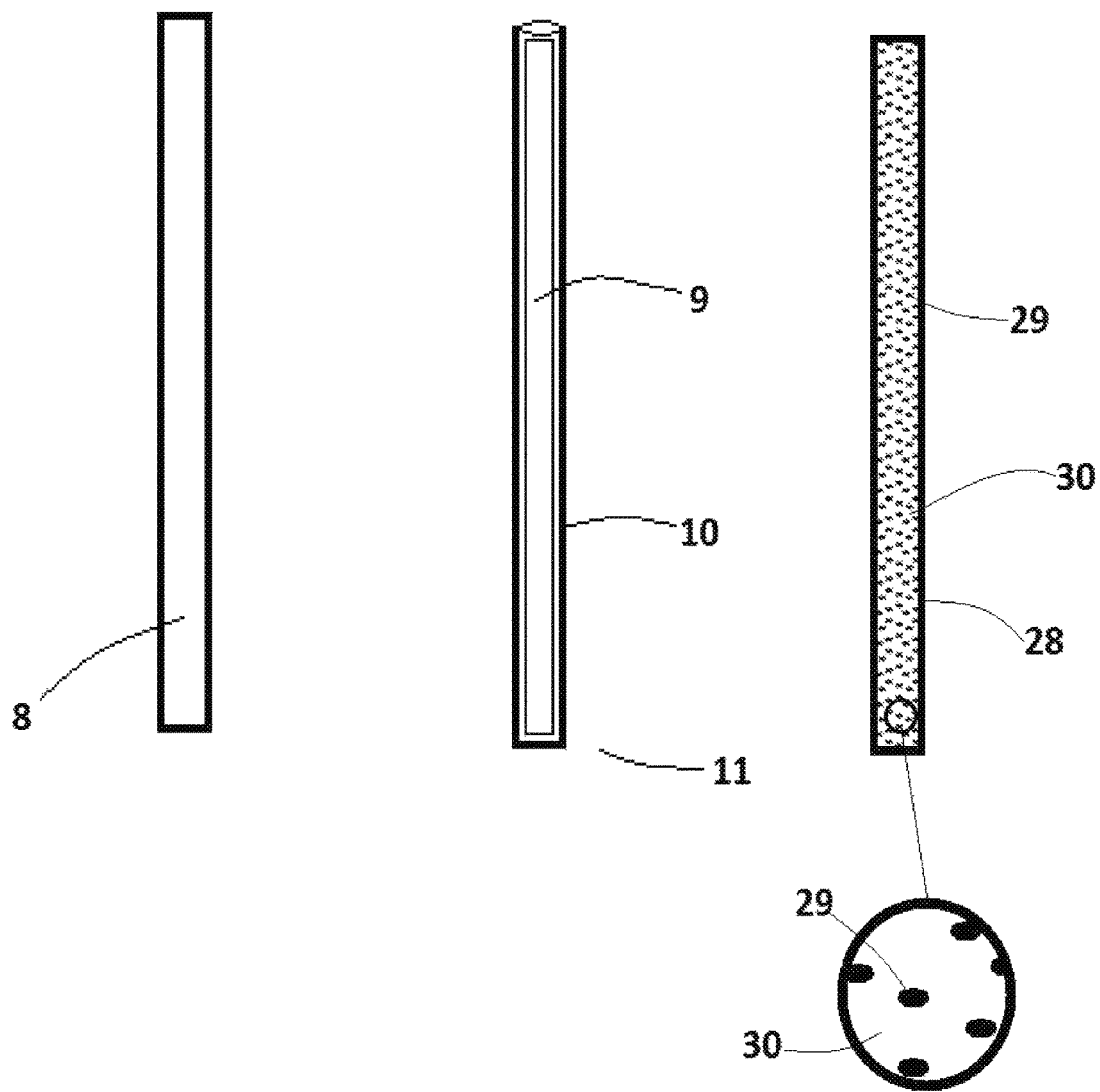
FIG. 4 is a drawing of a rod or bar of glass, a clad bar, and a rod or bar of composite material 28.

FIG. 4 illustrates three glass configurations that may be drawn into fibers for production of a converter plate. Rod or bar of glass 8 is a bulk homogenous material that produces light in the visible spectrum when excited by ultraviolet light. The glass that bar or rod 8 is made of may be made of any suitable glass type that is doped with a rare earth element to a level that optimizes quantum efficiency (number of photons out of the rod or bar per photons going in to the rod or bar) and emission wavelength per desired spectrum.

The material that is drawn into fibers for producing of the converter plate may also be a composite material 28 that is comprised of a host glass matrix 30 with grains or small particles of a phosphor 29 equally and uniformly dispersed throughout the glass. The phosphor 29 dispersed in the glass matrix 30 are particles small enough that they can flow with the glass when it is drawn and attenuated during the subsequent draw processes. Using a low temperature host glass 30 allows for a broad range of phosphors with desirable emission wavelengths to be incorporated in the converter plate assembly, consequently increasing the tunability of the final emission spectrum of the converter plate.

Core and clad glass assembly 11 may consist of a tube of glass that is optically active or not and a core bar or rod 9 of a glass with a specifically tuned emission spectrum when excited by ultraviolet light. Core material 9 may be of the composite type such as composite material 28 or may be the bulk homogenous glass type such as rod or bar of glass 8.

Figure 5:
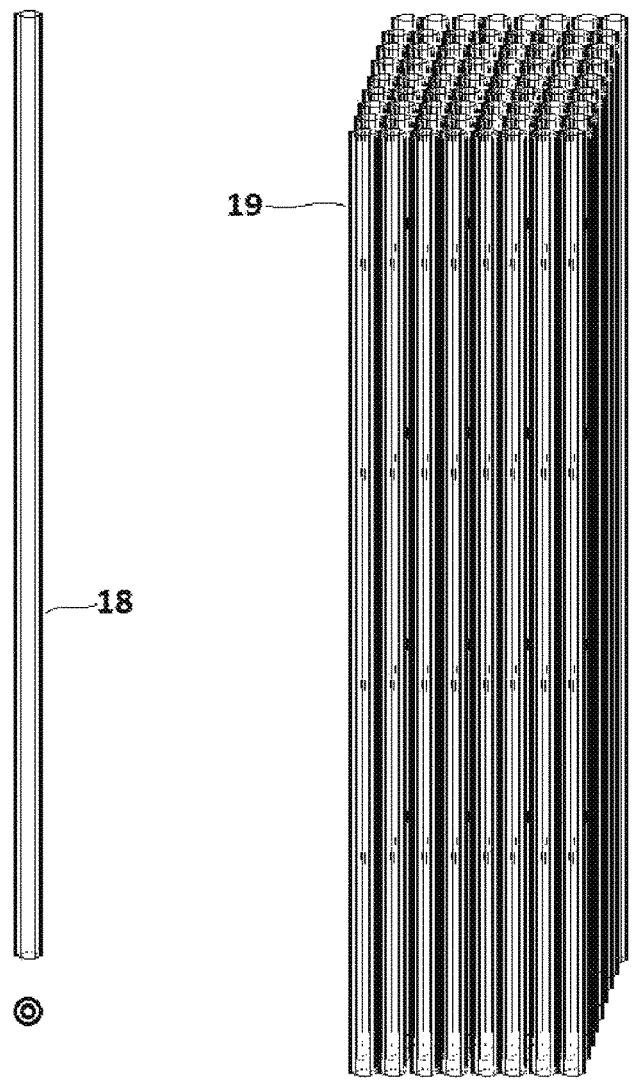
FIG. 5 is a drawing of a single fiber 18 that is used in a draw process and an array of fibers 19 that is yielded during a stacking process in accordance with the invention.

FIG. 5 illustrates a single fiber 18 that is used during the draw process and the subsequent array of fibers 19 that is yielded during the stacking process. Fibers 19 in the array may be circular, but in some instances a fiber may be drawn with a cross-sectional geometry that is hexagonal, square, trapezoidal, or any other cross section geometry. The fibers are typically on the order of several millimeters for maximum cross-sectional dimension. Fibers 19 are stacked into an array of fibers. The array may be built into a square array such as 9×9 fibers square or could also be built into a hexagonal, trapezoidal or any other cross-sectional geometry. The array is then drawn down into a new fiber referred to as a multi-fiber, which is a fiber of similar size to the starting fibers in the array, but now consisting of numerous optical elements. The multi-fiber can then be restacked into a fiber array and redrawn a second time to produce a fiber referred to as a multi-multi fiber with several hundreds or thousands of individual optical elements per fiber. The redrawing process can be repeated as many as three times to yield an individual fiber sizes that is on the order of several microns for maximum cross section geometry. During drawing of a fiber array, the multiple fibers are held together by any convenient mechanism such as by using pliable ridged wire or using clamps that are manufactured to conform to the respective cross-sectional geometry of the fiber array. As the fiber array is fed into the high temperature furnace during drawing, the clamps or wire holding the fibers together in the array are progressively slid up away from the furnace.

Figure 7:
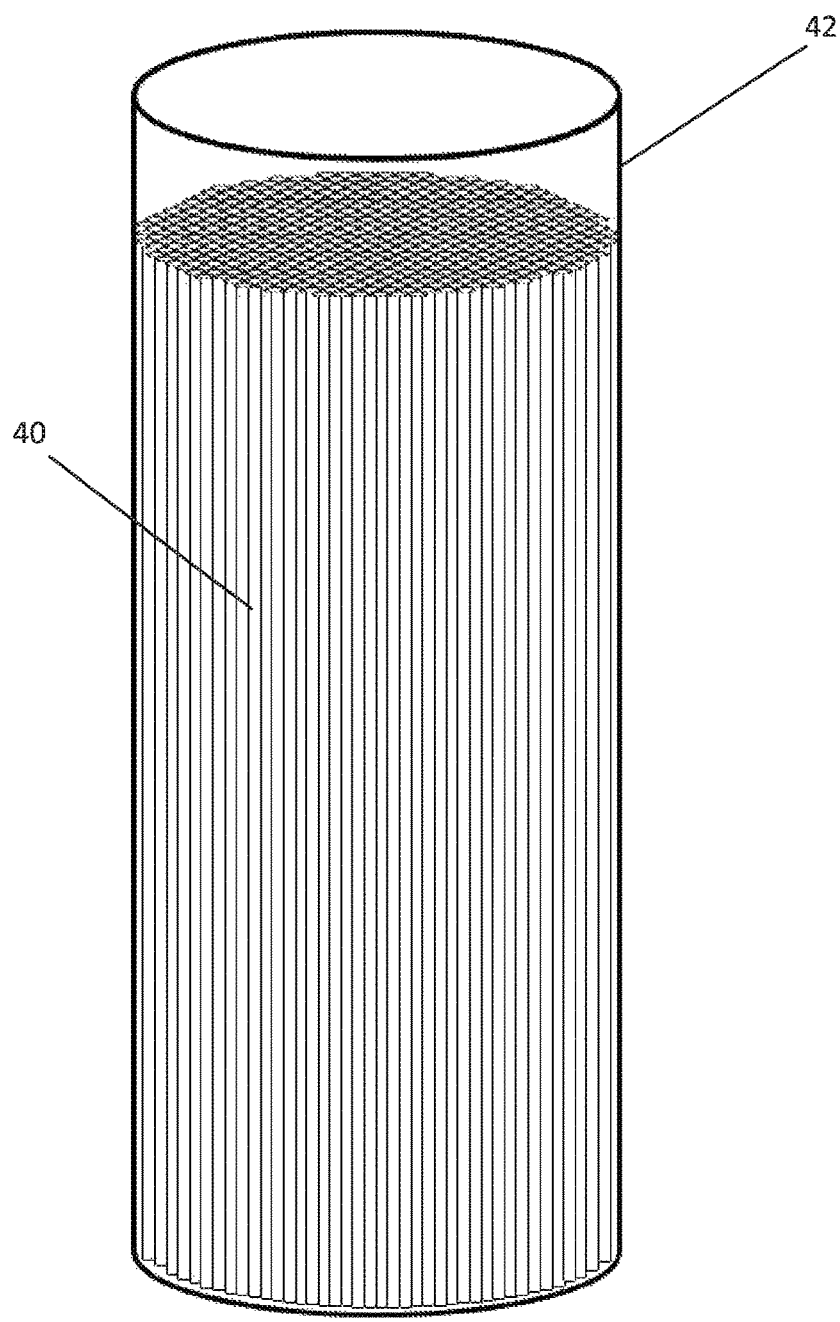
FIG. 7 is a drawing of fibers stacked within a glass tube

In some instances, as is shown in FIG. 7, it is preferable to stack or nest single fibers, multi-fibers, multi-multi-fibers, etc. 40 within a glass tube 42 and draw the tube containing the stacked or nested fibers, multi-fibers, multi-multi-fibers, etc. under vacuum to promote elimination of all voids and free interstitial volume between fibers and promote maximum level of adhesion, according to a technique disclosed in U.S. provisional application 62/463,693, filed Feb. 26, 2017 and in a U.S. patent application entitled "Twisted Glass Canes for Artists" filed by the inventors of the present patent application concurrently with the present application and commonly owned with the present application, the entire disclosures of which are hereby incorporated herein by reference.

Figure 6:
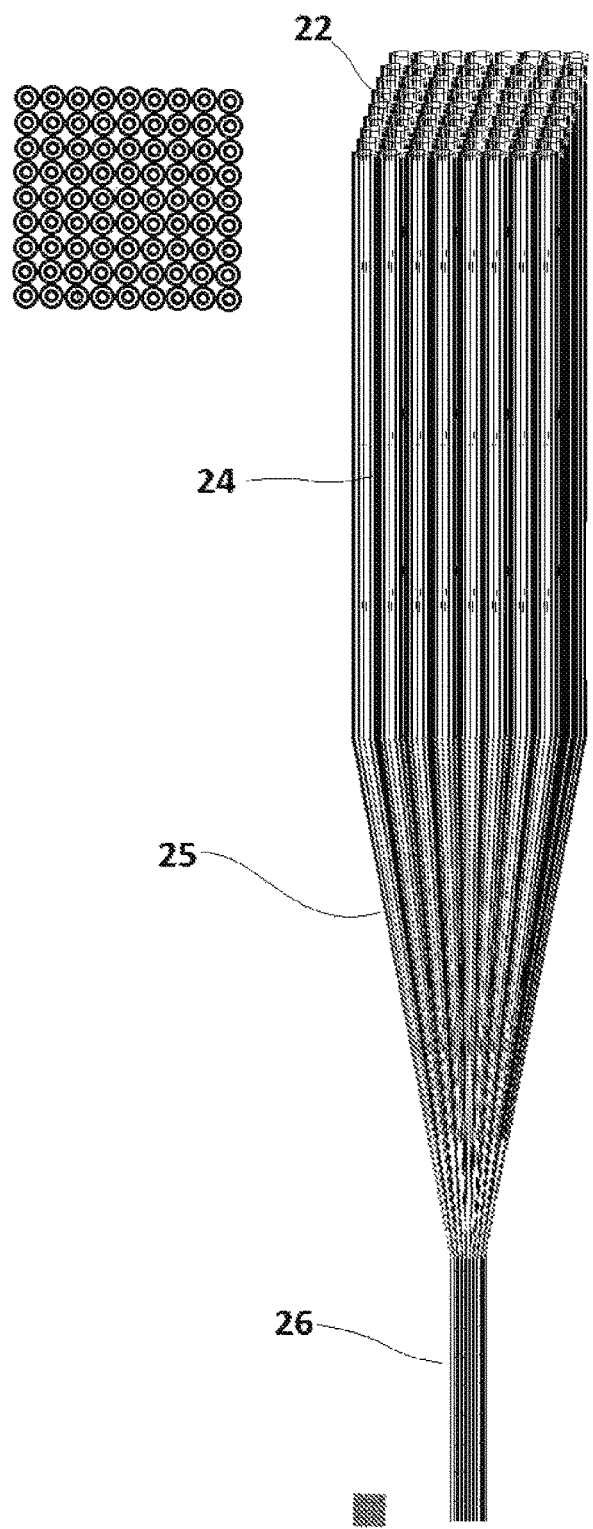
FIG. 6 is a drawing of an array of fibers being attenuated during the drawing process.

FIG. 6 illustrates an array of fibers 22 and the attenuation of the fibers during the drawing process. The fiber array 24 has a representative 9-by-9 fiber configuration and passes through the region 25 where the fiber array is attenuated into a smaller cross-sectional geometry during the draw process producing an attenuated fiber 26 that contains the same number of individual optical elements as the starting array. Fiber array 24 and attenuated fiber 26 have the same number of fibers in the cross section, but attenuated fiber 26 has the same scale as the single fibers from the beginning of the process.

There has been described a converter plate and methods for its manufacture. While several particular forms of the invention have been illustrated and described, it will be apparent that various modifications and combinations of the invention detailed in the text and drawings can be made without departing from the spirit and scope of the invention. Accordingly, it is not intended that the invention be limited, except as by the appended claims.

What is claimed is:

1. A converter plate comprising an array of optical fibers arranged axially parallel to each other, the optical fibers collectively having optical properties selected to convert light from a light-emitting diode entering the optical fibers from one end of the array of optical fibers to light comprising a plurality of emission wavelengths, exiting the fibers from another end of the array of optical fibers, the optical properties of some of the optical fibers differing from the optical properties of others of the optical fibers such that the light exiting one or more of the optical fibers has a first emission wavelength peak and the light exiting one or more others of the optical fibers has, instead of the first of emission wavelength peak, a second emission wavelength peak different from the first emission wavelength peak.

2. A converter plate in accordance with claim 1 wherein at least some the optical fibers are unclad.

3. A converter plate in accordance with claim 1 wherein at least some of the optical fibers are clad with a cladding.

4. A converter plate in accordance with claim 3 wherein the cladding is optically active.

5. A converter plate in accordance with claim 3 wherein the cladding causes total internal reflection within the optical fibers so that light exits only through an end of the optical fibers.

6. A converter plate in accordance with claim 3, wherein the cladding comprises a material that absorbs light and re-emits the light in a different wavelength.

7. A converter plate in accordance with claim 6, wherein the cladding also causes internal reflection within the optical fibers.

8. A converter plate in accordance with claim 1 wherein at least some of the optical fibers are formed of a host material that is intrinsically light-converting.

9. A converter plate in accordance with claim 1 wherein at least some of the optical fibers have a light-converting material incorporated into a host material that exhibits no light converting properties.

10. A converter plate in accordance with claim 1 wherein at least some of the optical fibers have a plurality of light-converting materials incorporated into a host material, the plurality of light-converting materials having differing optical properties.

11. A converter plate in accordance with claim 1 wherein the optical fibers have optical properties selected to convert UV or near-UV light from the light-emitting diode to light of a different wavelength.

12. A converter plate in accordance with claim 1 wherein the optical properties of the optical fibers are selected such that the light exiting different ones of the optical fibers has respective different emission wavelength peaks to produce collectively a continuous spectrum of light from the light from the light emitting diode.

13. A converter plate in accordance with claim 12 wherein the optical properties of the optical fibers are selected such that the light exiting different ones of the optical fibers has respective different emission wavelength peaks to produce collectively a full spectrum of white light from the light from the light emitting diode.

14. A converter plate manufactured in accordance with a method comprising:
providing optical fibers having optical properties selected to convert light entering the optical fibers from one end to light of a different wavelength exiting the fibers from another end, the optical properties of some of the optical fibers differing from the optical properties of others of the optical fibers such that the light exiting the some of the optical fibers would have a wavelength different from that of the light exiting the others of the optical fibers;
combining the optical fibers into a bundle, the optical fibers being arranged axially parallel to each other;
drawing the bundle of optical fibers to attenuate the bundle of fibers into a secondary fiber having a reduced cross section; and
wafering the secondary fiber into a converter plate comprising an array of the optical fibers arranged axially parallel to each other.

15. A converter plate in accordance with claim 14, wherein, prior to the wafering step, the secondary fiber is combined with other secondary fibers as a bundle of secondary fibers arranged axially parallel to each other, and the bundle of secondary fibers is drawn to attenuate the bundle of secondary fibers into a tertiary fiber, and wherein the step of wafering the secondary fiber comprises wafering the tertiary fiber that includes the secondary fiber and the other secondary fibers.

16. A converter plate in accordance with claim 15, wherein prior to the wafering step, the tertiary fiber is combined with other tertiary fibers as a bundle of tertiary fibers arranged axially parallel to each other, and the bundle of tertiary fibers is drawn to attenuate the bundle of secondary fibers into quaternary fiber, and wherein the step of wafering the secondary fiber comprises wafering the quaternary fiber.

17. A converter plate in accordance with claim 14, wherein the step of drawing the bundle of optical fibers to attenuate the bundle of fibers into a secondary fiber having a reduced cross section comprises pulling the bundle of optical fibers through a furnace with an output rate of material passing through the furnace being greater than an input rate of material passing into the furnace.

18. A converter plate in accordance with claim 17, wherein the step of pulling the bundle of optical fibers through the furnace causes adjacent fibers to fuse to each other in a permanent bond.

19. A converter plate in accordance with claim 17, wherein the step of combining the optical fibers into a bundle comprises stacking the fibers within a tube, and the step of drawing the bundle of optical fibers comprises drawing the tube containing the optical fibers.

20. A method of manufacturing a converter plate, comprising:
providing optical fibers having optical properties selected to convert light entering the optical fibers from one end to light of a different wavelength exiting the fibers from another end, the optical properties of some of the optical fibers differing from the optical properties of others of the optical fibers such that the light exiting the some of the optical fibers would have a wavelength different from that of the light exiting the others of the optical fibers;
combining the optical fibers into a bundle, the optical fibers being arranged axially parallel to each other;
drawing the bundle of optical fibers to attenuate the bundle of fibers into a secondary fiber having a reduced cross section; and
wafering the secondary fiber into a converter plate comprising an array of the optical fibers arranged axially parallel to each other.

* * * * *